US006825650B1

(12) United States Patent
McCormack et al.

(10) Patent No.: US 6,825,650 B1
(45) Date of Patent: Nov. 30, 2004

(54) CURRENT MEASURING PROBE AND ELECTRICAL ENERGY METER FOR USE THEREWITH

(75) Inventors: Michael McCormack, Castleroy (IE); Thomas Sorensen, Annacotty (IE)

(73) Assignee: Suparules Limited, Castleroy (IE)

( * ) Notice: Subject to any disclaimer, the term of this patent is extended or adjusted under 35 U.S.C. 154(b) by 0 days.

(21) Appl. No.: 09/890,126

(22) PCT Filed: Jan. 28, 2000

(86) PCT No.: PCT/IE00/00012

§ 371 (c)(1),
(2), (4) Date: Feb. 20, 2002

(87) PCT Pub. No.: WO00/45183

PCT Pub. Date: Aug. 3, 2000

(Under 37 CFR 1.47)

(30) Foreign Application Priority Data

Jan. 29, 1999 (IE) .............................................. S990061
Jul. 16, 1999 (IE) .............................................. S990607

(51) Int. Cl.[7] .............................................. G01R 15/18
(52) U.S. Cl. ...................................... 324/127; 324/126
(58) Field of Search ........................... 324/117 R, 126, 324/127, 142

(56) References Cited

U.S. PATENT DOCUMENTS

| 2,345,430 | A | * | 3/1944 | Rich ........................... 324/127 |
| 3,626,291 | A | | 12/1971 | Yauch et al. |
| 4,709,205 | A | | 11/1987 | Baurand et al. |
| 4,799,005 | A | * | 1/1989 | Fernandes .................... 324/127 |
| 5,012,218 | A | * | 4/1991 | Haug et al. .................. 336/174 |
| 5,049,809 | A | * | 9/1991 | Wakatsuki et al. ...... 324/117 R |
| 5,057,769 | A | | 10/1991 | Edwards |
| 5,426,360 | A | | 6/1995 | Maraio et al. |
| 5,442,280 | A | * | 8/1995 | Baudart ...................... 324/127 |

FOREIGN PATENT DOCUMENTS

| DE | 197 12 239 C1 | 8/1998 |
| EP | 0 338 542 A1 | 10/1989 |
| EP | 0 689 057 A2 | 12/1995 |
| JP | 7333248 | 12/1995 |

* cited by examiner

Primary Examiner—Evan Pert
Assistant Examiner—Russell M Kobert
(74) Attorney, Agent, or Firm—Whiteford, Taylor & Preston LLP; Gregory M. Stone; Jeffrey C. Maynard

(57) ABSTRACT

An electrical energy meter comprises an electrically insulating housing (10) for securing relative to least two mains cables (22,24) each having a conductive core surrounded by a sheath of insulating material. The housing includes respective electrical contacts for piercing the insulating sheath of each cable, a current probe for measuring current flowing in at least one of the cables, and circuit means for calculating and displaying electrical energy as a function of the voltage across the contacts and the output of the current probe. An improved current probe is employed comprising a series of Rogowski coils equally spaced around the circumference of a circle, with the gap between two adjacent coils permitting the current-carrying conductor to be introduced into the loop. An alternative current probe employs two such concentric loops of coils, enabling compensation for the effects of external current source pickup.

13 Claims, 4 Drawing Sheets

SIGNAL OUT

CURRENT MEASURING PROBE AND ELECTRICAL ENERGY METER FOR USE THEREWITH

This invention relates to electrical energy meters and to a current probe for use in such meters.

Standard electro-mechanical electrical energy meters have some or all of the following disadvantages.

They all consume a significant amount of power to operate. The IEC standard for class II meters is <2 watts. This power consumption amounts to between 0.25% to 0.5% of all power consumed. Losses due to metering are therefore substantial.

They have inertia problems when starting; therefore they must have a certain amount of power being drawn before they start to register.

They can only be installed by skilled personnel, and their installation is time-consuming. Electro-mechanical meters need to be fixed firmly to a flat surface in an upright position. In territories such as the former Soviet Union when metering is being installed in volume for the first time, the cost of installation of the electro-mechanical meters is high.

In conventional one wire current probes (see FIG. 1), a loop 1 of magnetic material surrounds a current carrying conductor 2 and a coil 3 comprising a large number of turns of wire is wound on the magnetic material 1. This type of probe relies on Ampere's Law which states that the integral of the magnetic field around a closed loop surrounding a current source is equal to the current enclosed.

In a well designed probe of this kind the voltage or current induced in the coil 3 is not dependent on the position of the source current (conductor 2) within the cross section surrounded by the closed magnetic core 1. Furthermore, the ratio of pickup voltage or current from the current source 2 within the closed magnetic ring core 1, compared to the pickup from the same source when it is located outside the closed magnetic ring core is very large, e.g. >1000:1.

This ensures that stray pickup from interfering current sources which may be located close to the probe but outside the magnetic ring core do not affect the measurements obtained from the required source which is located inside.

One of the disadvantages of this type of probe however is its cost. The magnetic core must be manufactured in two or more sections to allow the core to be opened and closed so that the conductor can be inserted. In order to make an accurate measurement the alignment of the two sections on closing is critical, as is the requirement that even a small air gap between sections on meeting is not allowed.

U.S. Pat. No. 5,057,769 discloses a probe having a gap 4 (see FIG. 2) in a continuously wound non-magnetic core coil 5 to allow the insertion of the current source. In order to maintain the desirable features of the continuous winding closed non-magnetic core 5, an effort is made to add back in the voltage component that would have been picked up by the coil turns which were removed to provide the air gap 4, by adding two individual multi-turn coils 6 at either side of the gap 4.

Even with the correct number of turns in these coils this is only partly successful. The voltage pickup of the probe is dependent on the location of the source conductor within the internal cross section of the coil. The closer the source current carrying conductor is to the gap or the windings, and the larger the gap, the greater the variation in pickup.

Furthermore, with this design, the pickup from sources in area 7 outside the core gap cross-section is no longer negligible and the pickup from an external current source increases as the gap increases, or as the external sources approach the gap. This can pose a serious limitation especially when measurements are being performed in a distribution box for example, where there may be a large number of conductors carrying various currents in a confined space.

It is an object of the invention to provide a low cost, low power meter which is quick and easy to install and which may, if desired, be retro-fitted to existing mains installations. In particular, it is an object to provide a meter which may be fitted easily to domestic power supplies.

It is a further object to provide an improved probe exhibiting less interference from external sources than in the prior art, without resorting to expensive designs.

According to the present invention there is provided an electrical energy meter comprising an electrically insulating housing for securing relative to least two mains cables each having a conductive core surrounded by a sheath of insulating material, the housing including respective electrical contact means for piercing the insulating sheath of each cable to make contact with the core, sensing means for providing an output corresponding to the current flowing in at least one of the cables, and circuit means for calculating and displaying electrical energy as a function of the voltage across the contact means and the output of the sensing means.

In a further aspect, the invention provides a current probe for measuring current in a conductor, comprising a plurality of coils connected together in series in an arrangement which substantially surrounds the cable in which current is to be measured.

Preferably, said coils are substantially equidistantly spaced in the form of an open loop, with a gap being provided between two of the coils in the loop, said gap enabling introduction of the conductor into the interior of the loop.

In a particularly preferred current probe, the coils are arranged in two concentric loops of coils, each loop being connected in series, and each loop having a gap between two of the coils in the loop, said gaps enabling introduction of the conductor into the interior of the concentric loops.

Preferably, in such an embodiment, there is also provided an electronic circuit for comparing the pickup from external sources experienced by each of the two loops and providing an output which compensates for such pickup, based on the respective dimensions of the loops.

An embodiment of the invention will now be described, by way of example, with reference to the accompanying drawings, in which.

In the following description, expressions of orientation are used for convenience only and are not intended to limit the orientation of the meter in use.

Figure 3:
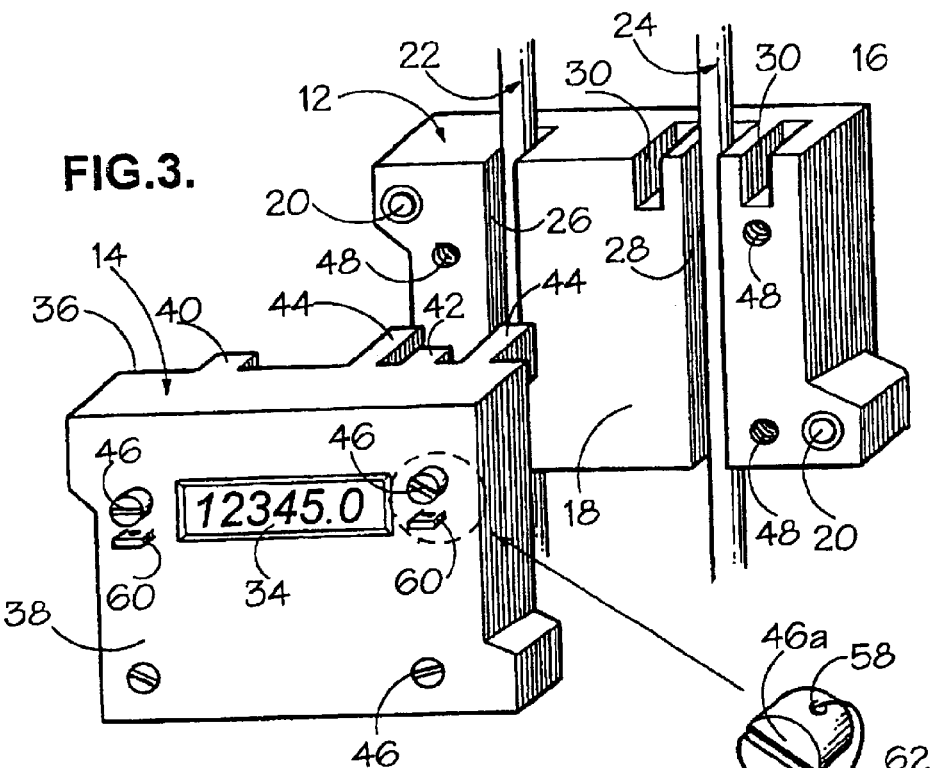
FIG. 3 is a perspective view of a meter according to the invention with the front plate removed.
Figure 5:
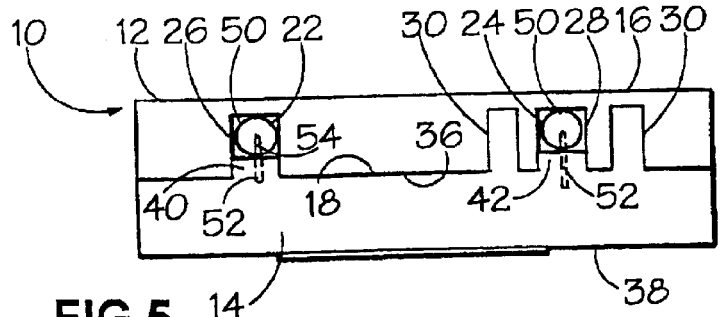
FIG. 5 is a horizontal cross-section through the meter.
Figure 4:
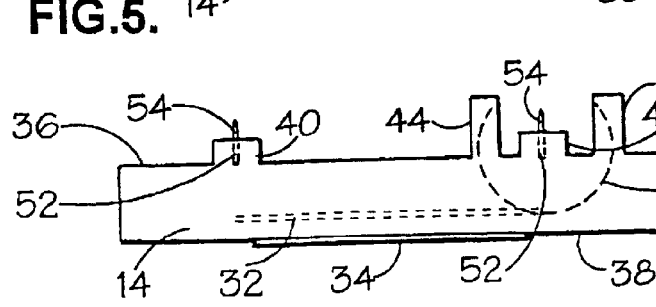
FIG. 4 is a top plan view of the front plate of the meter of FIG. 5.

Referring to FIGS. 3–5, an electrical energy meter is shown for measuring and displaying the amount of energy supplied by a pair of mains live and neutral cables 22, 24 respectively, each having an inner conductive core surrounded by an outer sheath of insulating material.

The meter comprises a housing 10 formed in two parts, herein referred to as a back plate 12 and a front plate 14, moulded from an electrically insulating plastics material. The back plate 12 is a solid block having a flat rear surface 16 and a shaped front surface 18. The back plate 12 has two holes 20 to receive fixing devices such as screws or bolts (not shown) which allow the back plate to be fastened with its rear surface 16 flat against a wall or other supporting surface (also not shown) behind the mains cables 22, 24. The latter are, in use, placed across the front surface 18 of the back plate 12 such that each lies in and along a respective one of a pair of parallel vertical guide channels 26, 28 in the surface 18. The front surface 18 also has a pair of recesses 30 disposed closely one on each side of the upper end of the channel 28 containing the neutral cable 24.

The front plate 14, which is hollow to contain a printed circuit board 32 and an LCD counter 34 to be described, has a shaped rear surface 36 and a substantially flat front surface 38. The rear surface 36 has a pair of parallel vertical ribs 40, 42 and a pair of parallel projections 44 disposed closely one on each side of the upper part of the rib 42. The ribs 40, 42 and projections 44 on the rear surface 36 are shaped and located such that they are substantially complementary to the channels 26, 28 and recesses 30 in the front surface 18 of the back plate 12.

In use, when the back plate 12 has been fixed to a wall or other support surface with the cables 22, 24 disposed in the channels 26, 28 as described, the front plate 14 is offered to the back plate 12 with the ribs 40, 42 in register with the channels 26, 28 respectively and the projections 44 in register with respective recesses 30, and the front plate is then pushed towards the back plate such that the ribs enter the channels and the projections enter the recesses. The front plate 14 is clamped to the back plate 12 in this position by means of four bolts 46 which pass through the front plate and engage respective screw-threaded inserts 48 embedded in the back plate, the bolts 46 being tightened until the rear surface 36 of the front plate comes to abut against the front surface 18 of the back plate.

As seen in FIG. 5, the width of each channel 26, 28 is substantially the same as the diameter of the respective cable 22 or 24, while the depth of each rib 40, 42 is less than the depth of the corresponding channel 26, 28 by a distance substantially the same as the diameter of the respective cable 22 or 24. Thus, when the two plates 12, 14 are clamped together as aforesaid, each cable 22, 24 is snugly accommodated in a respective vertical bore 50 of square cross-section in the housing 10.

Each rib 40, 42 has a respective electrical contact 52, FIG. 4, securely embedded therein, each contact having a pointed forward end 54 projecting centrally from the free end of the rib. Thus, when the front and back plates 12, 14 are clamped together as aforesaid, each forward end 54 of a contact 52 automatically pierces the insulating sheath of the corresponding cable 22 or 24 to establish electrical contact with the conductive core. In use, therefore, the contacts 52 tap the instantaneous voltage across the cables 22, 24.

In addition to the contacts 52 for tapping the voltage across the cables 22 and 24, the front plate 14 also contains one or more coils for sensing, by induction, the instantaneous current in the neutral cable 24 and providing an output signal corresponding to such current. In the illustrated, preferred embodiment of FIGS. 3–5, such sensing is effected by a series of coils 56 (described in greater detail below with reference to FIGS. 7-9) embedded in and behind the projections 44 so as to surround the cable 24 on three sides. However, the skilled person will appreciate that the design of meter discussed above can employ any suitable current sensing means, while retaining the advantages of ease of manufacture and installation.

The voltage tapped by the contacts 52 and the output of the current sensing coils 56 are connected to an energy-calculating circuit (not shown) mounted on the printed circuit board 32. Such circuit may be of conventional design and is arranged to calculate, in known manner from the tapped voltage and the sensed current, the electrical energy in KWhrs supplied by the cables 22, 24. The circuit drives an LED counter 34 which displays the calculated result.

Figure 6:
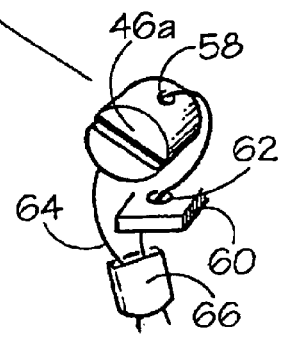
FIG. 6 illustrates a security device for the meter.

In order to prevent tampering with the meter, the head 46a, FIG. 6, of at least one of the bolts 46 projects from the front surface 38 of the front plate 14 and has a cross bore 58. Just below each such bolt there is a respective tab 60 projecting from and securely embedded in the front surface 38, each tab having a hole 62. A wire 64 passing through the bore 58 and hole 62 and sealed at 66 prevents the bolt 46 from being turned sufficiently to remove the front plate 14 from the back plate 12.

The arrangement of coils will now be described in more detail with reference to a current probe illustrated in FIG. 7.

The probe comprises a series of N (in this case N=7) identical Rogowski coils 56 equally spaced along the circumference of a circle.

The spacing between any pair of adjacent coils 56 may be used to insert a current conductor to be measured, such that the current-carrying conductor is partially surrounded by the circular array of coils. This arrangement suffers, to some extent, from the same effects as the probe of FIG. 2 (i.e. the voltage pickup of the probe is dependent on the location of the source conductor within the internal cross section of the coil, and the pickup from outside the core gap must be taken into account).

Figure 1:
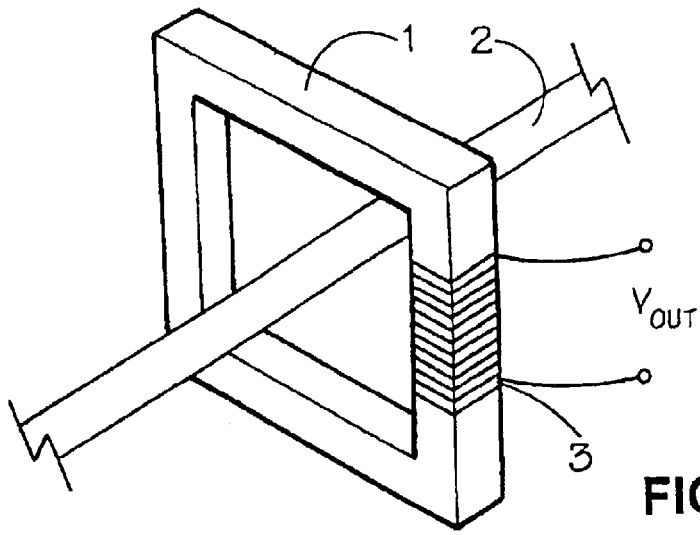
FIG. 1 is an illustration of a first known current probe arrangement.
Figure 2:
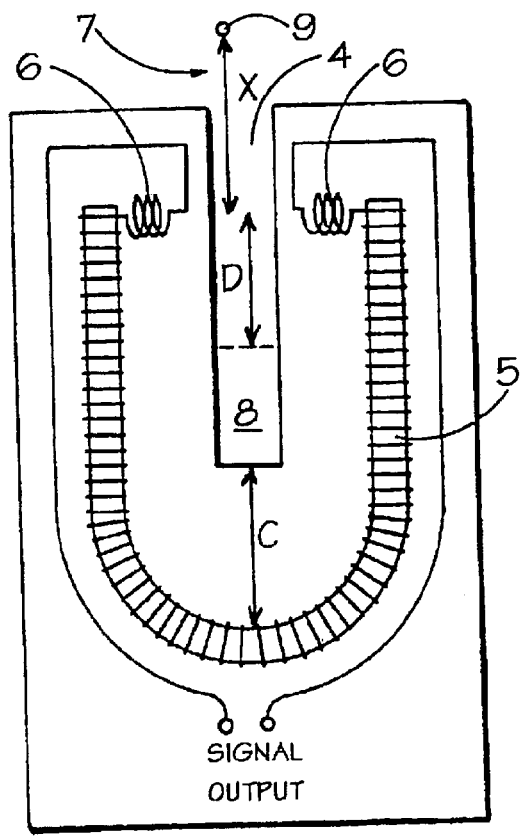
FIG. 2 is an illustration of a second known current probe arrangement.
Figure 7:
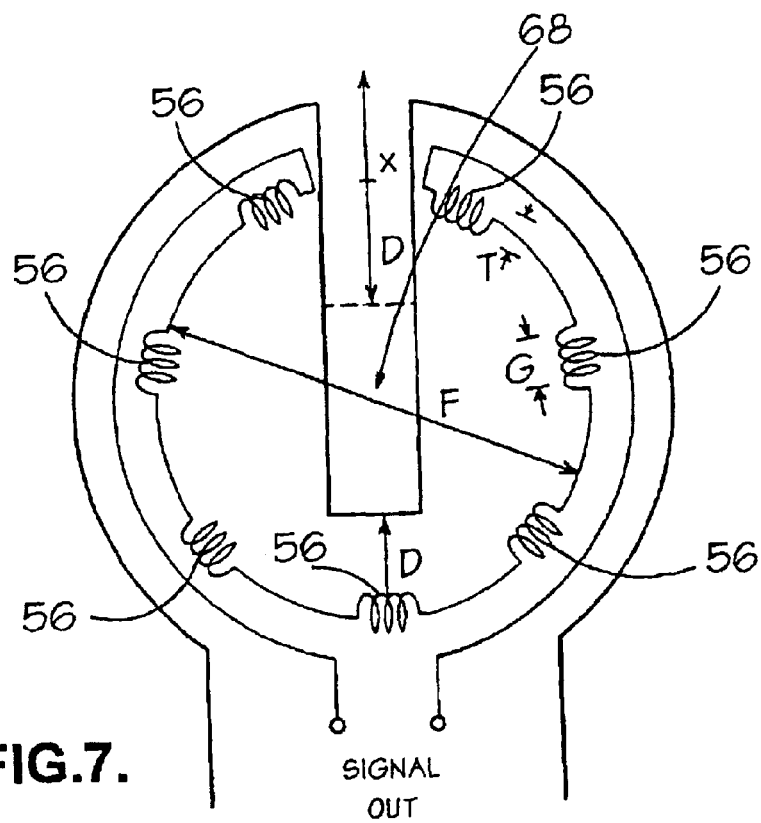
FIG. 7 is a diagram of a current probe according to the invention schematically illustrating the arrangement of coils in the meter of FIGS. 3–6.

At this point it is useful to compare the performances of the probes shown in FIGS. 2 and 7.

In the FIG. 2 design, the closer the current carrying conductor is to the gap or the windings the greater the variation in pickup. As expected, the larger the gap the larger the variation in pickup levels. However this variation can be kept within acceptable limits. For example variations of less than ±3% may be obtained with gaps of about 1.6 cm if the source current conductor is confined to a rectangular area 8 (FIG. 2) which begins a distance D (approximately 10 mm) from the centre of the gap and ends a distance C, (also approximately 10 mm), from the continuous windings 5.

Using the design of FIG. 7 with the dimensions given above the variation in reading obtained may also be kept less than ±3% if the current conductor is confined to the rectangular area 68 which is less than the width of the gap and stretches vertically from the dotted line located at distance D, where D=10 mm, from the circumference diametrically opposite. This performance is very similar to the probe design shown in FIG. 2.

However, using the design of FIG. 7, the error in measurement due to these effects gets smaller as the number N of individual coils increases.

As the number N of coils increases however, for a given diameter F of circle, the gap between individual coils decreases, as does the diameter of conductor that may be inserted. Preferably, one will use the maximum number of individual coils possible that still accommodates the largest conductor diameter required in the application. For example if the design requires a maximum source conductor diameter of 14 mm and the coils are arranged in a circle having a diameter F=42.5 mm, then the maximum number of individual coils that may be used is seven. This leaves space for individual coil widths G of 2 mm and an enclosure thickness of 1 mm.

A very important feature of the probe design is the pickup ratio or interference ratio R between the pickup from an external source 9 (see FIG. 2), at a distance x from the gap, and the pickup from the same source when it is located in the measurement area 8. This ratio R should be minimised.

For a typical well designed probe with the configuration of FIG. 2, Table 1 shows the calculated value of pickup ratio R, expressed as a percentage for increasing values of x expressed in mm. The dimensions of the continuous coil portion 15 of the probe are taken as 50 mm long by 31 mm wide in the calculations of Table 1. These dimensions are typical for this type of probe.

TABLE 1

| R % | x mm |
|---|---|
| 22 | 4 |
| 12 | 6 |
| 7 | 8 |
| 4 | 10 |
| 2.1 | 12 |
| 1.2 | 14 |
| 0.8 | 16 |
| 0.6 | 18 |
| 0.5 | 20 |
| 0.4 | 22 |
| 0.32 | 24 |
| 0.28 | 26 |
| 0.20 | 34 |

It can be seen from Table 1 that in order to maintain an error of less than 2% due to an interfering source of the same current magnitude as the source being measured, the distance x must be greater than about 12 mm. Since the minimum value of D is 10 mm in this design then the minimum spacing (x+D) between the interfering source and the source being measured must be greater than 22 mm.

It is quite possible in the case of a distribution box, for example, that the interfering source current could be a factor of ten or more larger then the current being measured. For a factor of ten difference, the distance x to the source must be greater than 34 mm in order to maintain a maximum error of less than 2% due to interference and thus the total separation between measured and interfering sources would have to be greater than 44 mm.

The pickup ratio R as defined above is shown in Table 2(a) for the probe of FIG. 7 having a diameter F of 42.5 mm.

TABLE 2 (a)

| R % | x mm |
|---|---|
| 20 | 4 |
| 13.3 | 6 |
| 8.6 | 8 |
| 5.6 | 10 |
| 3.7 | 12 |
| 2.54 | 14 |
| 1.7 | 16 |

TABLE 2 (a)-continued

| R % | x mm |
|---|---|
| 1.2 | 18 |
| 0.87 | 20 |

F = 42.5 mm
N = 7

If Table 1 and Table 2(a) are compared it is seen that for values of x less than 6 mm, the system of FIG. 7 is slightly better than that of FIG. 2. However, as x increases beyond 6 mm the system of FIG. 7 can be better by as much as a factor of 2 at x=18 mm.

Figure 8:
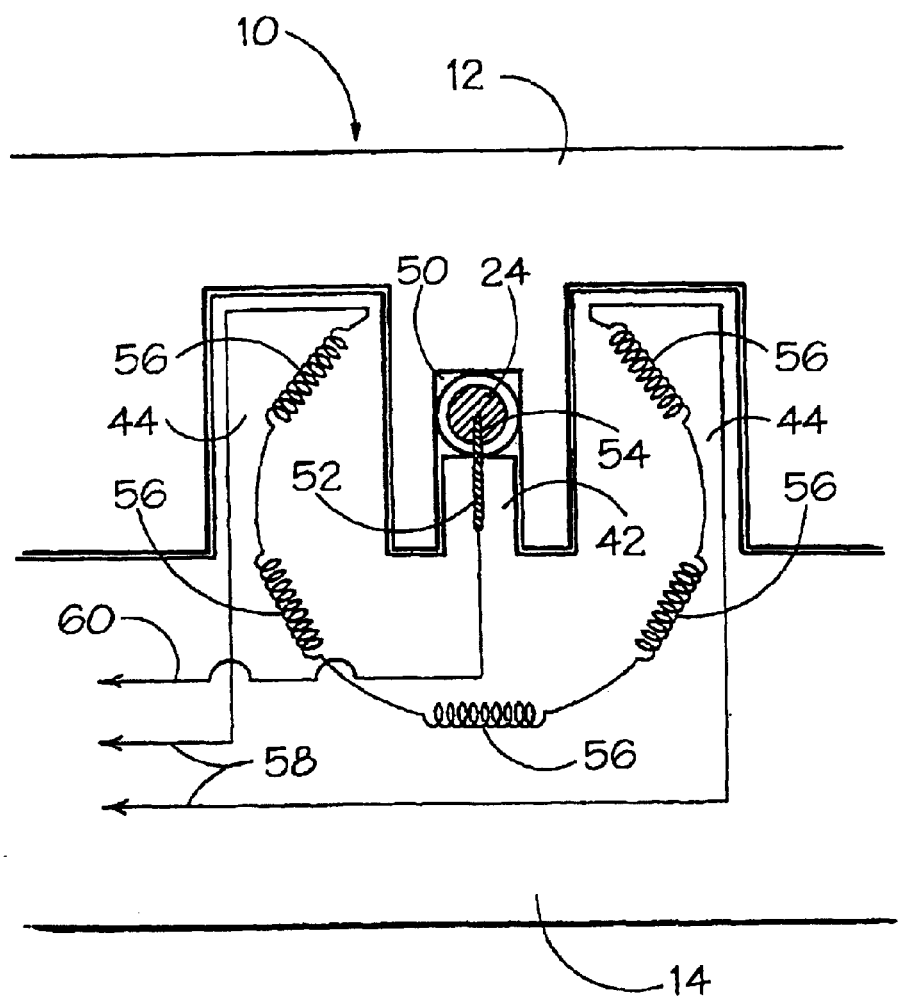
FIG. 8 is a sectional plan view of a detail of the meter of FIGS. 3–6 showing the arrangement of coils therein.

FIG. 8 shows a simple embodiment of such a coil arrangement in greater detail. In FIG. 8 one can see a portion of the back plate 12 and front plate 14 in the vicinity of rib 42, projections 44, and neutral cable 24. It can be seen that neutral cable 24 is pierced by forward end 54 of contact 52, which is connected via a voltage take-off conductor 60 to the PCB (not shown). The voltage between the live and neutral conductors is used to power the PCB measurement circuitry and the LCD display.

For simplicity, FIG. 8 shows a series of only five coils 56 arranged around the circumference of a circle, and connected in series. A gap between the two uppermost (as seen in FIG. 8) coils 56 admits neutral cable 24. The voltage generated in the series of coils is carried via a pair of conductors 58 to the PCB where the current within the neutral conductor is determined from the calibration of the coils 56.

The greater the number of equally spaced coils 56 and hence the smaller the gap between adjacent coils, the more sensitive the device will be, when this coil arrangement is used. Obviously, while only 5 coils are shown for simplicity in the FIG. 8 view, one will aim to maximise the number of coils consistent with the diameter of the conductor, by varying the design of the meter and thereby reducing the gap size.

Advantages of the meter described above are that it may be manufactured at low cost and is easy and quick to install to existing mains systems. It can be designed to use <40 mwatts to power itself, being less than 2% of the power required by existing analog meters. It does not suffer from inertia and will register power at 50 times lower levels than existing meters.

Furthermore, by employing the current probe arrangement of the invention, the interference from external current sources can be reduced significantly.

Although the foregoing has described an embodiment where the meter is designed for use with a single pair of live and neutral cables, the invention is applicable to other mains systems, for example with three phase and one neutral cable.

The current probe can be improved by adding a second set of coils. To understand how this improvement occurs, the pickup ratio R is now examined for a set of seven coils identical to those discussed above for FIG. 7, but arranged on a 46.5 mm circle rather than 42.5 mm.

Table 2(b) displays the pickup ratio R for this arrangement of seven coils as a function of x. The distance x in this case is measured from the circumference of the larger circle.

TABLE 2 (b)

| R % | x mm |
|---|---|
| 25.2 | 4 |
| 17 | 6 |
| 11 | 8 |
| 8 | 10 |
| 5.4 | 12 |
| 3.7 | 14 |
| 2.6 | 16 |
| 1.9 | 18 |
| 1.37 | 20 |

F = 46.5 mm
N = 7

If both sets of seven coils each are present with their diameters differing by 4 mm then an interfering source at a distance x from the circumference of the inner circle would be a distance (x−2) mm from the outer circumference.

If the ratio R picked up by the inner set at a distance x, as shown in Table 2(a), is compared with that picked up from the same interference location by the outer set, at a distance x−2, as shown in Table 2(b), it is observed that they differ in level by a factor of 2 approximately, with the outer set picking up twice the interference level of the inner set approximately. For convenience, Tables 2(a) and (b) are set out again, alongside one another:

TABLE 2

| R % | x mm | R % | x mm |
|---|---|---|---|
| 20 | 4 | 25.2 | 4 |
| 13.3 | 6 | 17 | 6 |
| 8.6 | 8 | 11 | 8 |
| 5.6 | 10 | 8 | 10 |
| 3.7 | 12 | 5.4 | 12 |
| 2.54 | 14 | 3.7 | 14 |
| 1.7 | 16 | 2.6 | 16 |
| 1.2 | 18 | 1.9 | 18 |
| 0.87 | 20 | 1.37 | 20 |

(a) F = 42.5 mm
N = 7
(b) F = 46.5 mm
N = 7

For example, a source at x=10 mm from the inner coils will exhibit a pickup ratio R=5.6% in the inner coil set. The same source is 8 mm from the outer coils, in which a pickup ratio of R=11% is generated.

This factor 2 remains almost constant for different values of x. It is therefore possible, irrespective of the distance x, to cancel out a large proportion of the interference by subtracting approximately half the voltage picked up by the outer set from that picked up by the inner set. The factor of 0.5 is approximately the correct factor to use for these two particular coil set diameters each comprising seven identical coils.

For greater differences between the inner and outer coil set diameters there is an increase in the factor by which the interference pickup from the outer set is greater than that of the inner set. To compensate, therefore, one must subtract a smaller amount of the outer set pickup from that of the inner set in order to minimise interference. Best cancellation of interference at all distances x is obtained by minimising the difference between the diameters of both sets of coils that are used. Preferably the individual coil diameters (dimension "T" in FIG. 7) are reduced to assist in this regard.

Figure 9:
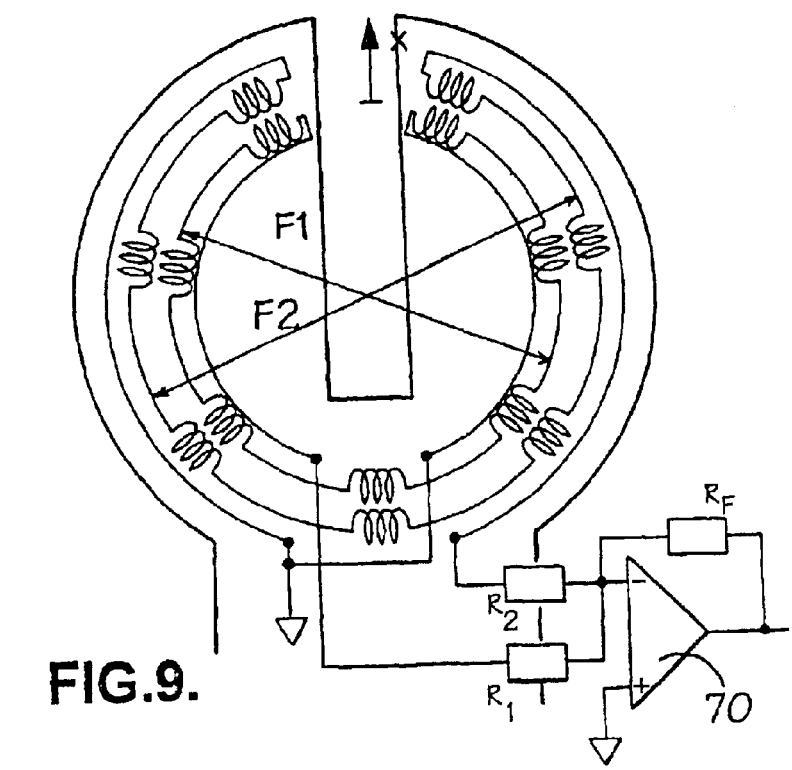
FIG. 9 is a diagram of an alternative current probe according to the invention which can be incorporated in the meters of the invention.

The configuration of this minimum interference probe is shown in FIG. 9 together with a front end amplifier 70. The factor of pickup voltage from the outer set that is subtracted from the voltage pickup of the inner set is directly proportional to the ratio of resistor values R1/R2.

Table 3 shows the interference ratio R as a function of x for the coil arrangement of FIG. 9. In this table x is measured as the distance outwards from a point midway between the inner and outer circumferences. The results shown are for an inner diameter F1=42.5 mm and an outer diameter F2=47.5 mm. R1 is chosen to be 0.52 R2 in this design so that the effective input signal is the voltage pickup from the inner set minus 0.52 times the pickup from the outer set.

If one compares the values of pickup ratio R of Table 3 to those of Table 1 (i.e. comparing the configuration of FIG. 9 with that of FIG. 2) it is seen that the interference of this new probe is far less than that of the old probe at any distance x. In fact the rejection is a minimum factor of 3.7 lower at x=4 mm and increases to a factor of 33 lower at x=20 mm.

The configuration of FIG. 9 thus shows significant advantages over the configuration of FIG. 2 allowing the use of smaller probes with less interference.

TABLE 3

| R % | X mm |
|---|---|
| 6 | 4 |
| 2.4 | 6 |
| 0.95 | 8 |
| 0.41 | 10 |
| 0.18 | 12 |
| 0.08 | 14 |
| 0.04 | 16 |
| 0.024 | 18 |
| 0.15 | 20 |

In preferred probes according to the invention, therefore, the double coil arrangement of FIG. 9 may be used, subject to design variations in dimensions and numbers of coils.

A particularly preferred energy meter according to the invention incorporates, as its sensing means, the probe design of FIG. 9.

The invention is not limited to the embodiments described herein which may be modified or varied without departing from the scope of the invention.

What is claimed is:

1. A current probe for measuring current in a conductor, comprising a plurality of relatively fixed coils which define, and are substantially equally spaced apart along, a notional closed path surrounding the conductor, the coils being connected in series in such manner that an unobstructed gap is left between one pair of adjacent coils to enable the conductor to be introduced inside the closed path, wherein said coils are arranged in two concentric loops of coils, each loop being connected in series, and each loop having a gap between two of the coils in the loop, said gaps enabling introduction of the conductor into the interior of the concentric loops.

2. A current probe according to claim 1, wherein said coils are Rogowski coils.

3. A current probe according to claim 1, wherein said closed path is circular.

4. A current probe according to claim 1, further comprising an electronic circuit for comparing the pickup from external sources experienced by each of the two loops and providing an output which compensates for such pickup, based on the respective dimensions of the loops.

5. An electrical energy meter comprising an electrically insulating housing for securing relative to at least two mains cables each having a conductive core surrounded by a sheath of insulating material, the housing including respective electrical contact means for piercing the insulating sheath of each cable to make contact with the core, sensing means for providing an output corresponding to the current flowing in at least one of the cables, and circuit means for calculating and displaying electrical energy as a function of the voltage across the contact means and the output of the sensing means, said sensing means comprising a plurality of relatively fixed coils which define, and are substantially equally spaced apart along, a notional closed path surrounding the said at least one mains cable, the coils being connected in series in such manner that an unobstructed gap is left between one pair of adjacent coils to enable the said at least one mains cable to be introduced inside the closed path.

6. An electrical energy meter according to claim 5, wherein the housing comprises first and second parts which are movable with respect to one another from a first position in which the cables may be introduced into the housing, to a second position in which the cables are secured relative to the housing.

7. An electrical energy meter according to claim 6, wherein the movement of the housing parts between the first and second positions causes the electrical contact means to automatically pierce the cables.

8. An electrical energy meter according to claim 6, wherein the housing parts are separate from one another when in the first position, and wherein the housing parts are secured together in the second position.

9. An electrical energy meter according to claim 6, wherein the housing parts are connected together in an open position to receive the cables in the first position, and are closed towards one another in the second position to secure the cables therein.

10. An electrical energy meter according to claim 6, wherein the first part is a back plate having means for receiving the cables and wherein the second part is a front plate which abuts against the back plate, with the cables held therebetween, one of said back plate and front plate being provided with said contact means, whereby the cables are squeezed onto said contact means when the back and front plates are brought together.

11. An electrical energy meter according to claim 6, further comprising means for locking the first and second housing parts together in the second position.

12. An electrical energy meter according to claim 11, further comprising security means which co-operate with the locking means to indicate if the locking means has been tampered with.

13. An electrical energy meter according to claim 5, wherein all of the power requirements of the meter are drawn from the mains cables.

* * * * *